(12) United States Patent
Hashimoto et al.

(10) Patent No.: US 7,906,434 B2
(45) Date of Patent: Mar. 15, 2011

(54) MANUFACTURING METHOD OF SEMICONDUCTOR DEVICES

(75) Inventors: Junichi Hashimoto, Kanagawa-ken (JP); Mitsuhiro Omura, Kawasaki (JP); Yasuyoshi Hyodo, Tokyo (JP); Takamichi Tsuchiya, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 31 days.

(21) Appl. No.: 12/539,937

(22) Filed: Aug. 12, 2009

(65) Prior Publication Data

US 2010/0041235 A1 Feb. 18, 2010

(30) Foreign Application Priority Data

Aug. 15, 2008 (JP) ................................. 2008-209236

(51) Int. Cl.
*H01L 21/311* (2006.01)
(52) U.S. Cl. ........ 438/696; 438/714; 438/719; 438/723; 257/E21.312
(58) Field of Classification Search .................. 438/696, 438/703, 714, 719, 723, 724; 257/E21.267, 257/E21.312
See application file for complete search history.

(56) References Cited

U.S. PATENT DOCUMENTS

| | | | |
|---|---|---|---|
| 6,475,891 B2* | 11/2002 | Moon | 438/584 |
| 6,624,084 B2* | 9/2003 | Maeda et al. | 438/732 |
| 6,642,149 B2 | 11/2003 | Suemasa et al. | |
| 7,576,010 B2* | 8/2009 | Lee et al. | 438/717 |
| 7,737,039 B2* | 6/2010 | Sandhu et al. | 438/696 |
| 7,803,709 B2* | 9/2010 | Yune | 438/689 |
| 2004/0219797 A1 | 11/2004 | Honda et al. | |
| 2006/0234165 A1 | 10/2006 | Kamigaki et al. | |
| 2008/0138995 A1 | 6/2008 | Omura | |
| 2008/0188083 A1* | 8/2008 | Jeon et al. | 438/703 |

FOREIGN PATENT DOCUMENTS

JP 2006-303022 11/2006

* cited by examiner

*Primary Examiner* — Tuan N. Quach
(74) *Attorney, Agent, or Firm* — Finnegan, Henderson, Farabow, Garrett & Dunner, L.L.P.

(57) ABSTRACT

A semiconductor device manufacturing method includes: depositing a first insulating film and a second insulating film on a substrate sequentially and forming a pattern on the second insulating film; forming a silicon film on the pattern; forming a sidewall made of the silicon film by processing the silicon film until a part of the second insulating film is exposed by use of etch-back; removing the second insulating film; and performing dry etching by use of a fluorocarbon-based gas, to process the first insulating film by using the sidewall as a mask. The processing of the first insulating film includes applying on the substrate a self-bias voltage Vdc that satisfies a relational expression of Vdc<46x−890, where a film thickness of the silicon film that constitutes the sidewall is x nm ($19.5 \leqq x \leqq 22.1$).

20 Claims, 10 Drawing Sheets

A REGION WHERE THE TAPER ANGLE < 0.7° IS DEFINED AS THE WARPAGE-FREE REGION BECAUSE THE ERROR RANGE OF TAPER ANGLE MEASUREMENT IS ± 0.7°

MANUFACTURING METHOD OF SEMICONDUCTOR DEVICES

CROSS REFERENCE TO RELATED APPLICATION

This application claims benefit of priority under 35 USC §119 to Japanese patent application No. 2008-209236, filed on Aug. 15, 2008, the contents of which are incorporated by reference herein.

BACKGROUND OF THE INVENTION

1. Field of the Invention

The present invention relates to a manufacturing method of semiconductor devices.

2. Related Background Art

Recently, a sidewall transfer process has been proposed and used to realize finer patterning. According to the sidewall transfer process, patterns of a photo-resist are formed whose pitch is twice a target line width, the photo-resist is slimmed, an under-layer film is processed to form a core material pattern, a sidewall is deposited, the core material is removed, and the under-layer film is further processed to form a pattern having a line width smaller than a lithographic limit (see Japanese Patent Laid Open Pub. No. 2006-303022).

However, in a trial for further finer patterning, the top of a component of the sidewall, for example, an amorphous silicon film had once warped inward, that is, toward a side where the core material pattern existed when the under-layer film was being processed, thus resulting in a problem that the under-layer film could not be processed so as to have a predetermined design value. Such a problem was not observed with a pattern size of about 32 nm and may pose an obstacle to forming an interconnection line or shallow trench isolation (STI) pattern in a future, attempt to realize a pattern size of 30 nm or less.

SUMMARY OF THE INVENTION

According to a first aspect of the present invention, there is provided a semiconductor device manufacturing method comprising: depositing a first insulating film and a second insulating film above a substrate sequentially and forming a pattern on the second insulating film; forming a silicon film on the pattern; forming a sidewall made of the silicon film by processing the silicon film until a part of the second insulating film is exposed by use of etch-back; removing the second insulating film; and performing dry etching by use of a fluorocarbon-based gas, to process the first insulating film by using the sidewall as a mask, wherein processing of the first insulating film comprises applying on the substrate a self-bias voltage Vdc that satisfies a relational expression of Vdc<46x−890, where a film thickness of the silicon film that constitutes the sidewall is x nm (19.5≦x≦22.1).

According to a second aspect of the present invention, there is provided a semiconductor device manufacturing method comprising: depositing a first insulating film and a second insulating film above a substrate sequentially and forming a pattern on the second insulating film; forming a silicon film on the pattern; forming a sidewall made of the silicon film by processing the silicon film until a part of the second insulating film is exposed by use of etch-back; removing the second insulating film; and performing dry etching by use of a fluorocarbon-based gas, to process the first insulating film by using the sidewall as a mask, wherein processing of the first insulating film is carried out by using a semiconductor manufacturing apparatus comprising a reaction chamber, a substrate mounting table, a first power supply capable of supplying the substrate mounting table with a power having a first frequency, a second power supply capable of supplying the substrate mounting table with a power having a second frequency higher than the first frequency, and a blocking capacitor interposed between the substrate mounting table and the first and second power supplies, and by supplying the substrate mounting table with the power from the second power supply in a condition where supply of the power from the first power supply is halted.

BRIEF DESCRIPTION OF THE DRAWINGS

In the accompanying drawings:

FIGS. 1A to 2C are abbreviated cross-sectional views describing a first embodiment of a semiconductor device manufacturing method according to the present invention;

FIGS. 9A to 12B are abbreviated cross-sectional views describing a second embodiment of the semiconductor device manufacturing method according to the present invention.

DETAILED DESCRIPTION OF THE INVENTION

Embodiments of the present invention will be described below with reference to the drawings. In the drawings, identical reference numerals are given to identical components, and repetitive description on the identical components will be appropriately omitted.

(1) First Embodiment

A first embodiment of a semiconductor device manufacturing method according to the present invention will be described below with reference to FIGS. 1 to 8. The present embodiment relates to a formation of a trench structure for interconnection lines of a nonvolatile semiconductor storage device.

Figure 1A:
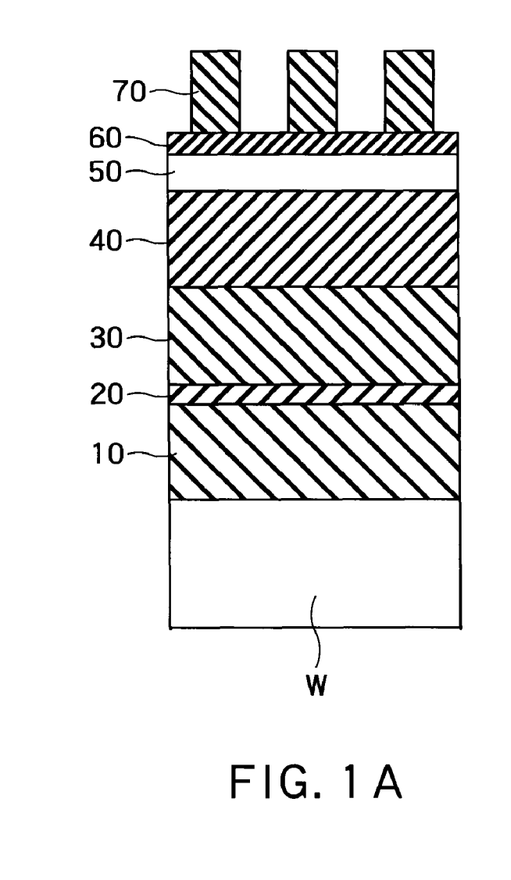

First, a layer stack film is formed on a substrate. Specifically, as shown in FIG. 1A, a silicon oxide film 10, a silicon nitride film 20, a silicon oxide film 30, a silicon nitride film 40, an amorphous silicon film 50, and an antireflection film 60 are deposited sequentially by low pressure chemical vapor deposition (LPCVD) on a substrate W on which semiconductor elements (not shown) are formed, and on which antireflection film 60 a photo-resist is applied. It is to be noted that the silicon nitride film 20 acts as a processing stopper and the silicon oxide film 30 acts as a base in which interconnection lines are embedded. The silicon nitride film 40 acts as a core material for forming sidewall patterns later. The silicon oxide film 30 and the silicon nitride film 40 correspond to, for example, first and second insulating films in the present embodiment.

Next, the photo-resist is processed into a desired pattern 70 by utilizing photo etching. In the present embodiment, it is processed into a line-and-space pattern which has a size ratio between a line and a space of about 1:1.

Subsequently, the antireflection film 60 and the amorphous silicon film 50 are processed through reactive ion etching (RIE) by using the pattern 70 as a mask, thereby providing an antireflection film 62 and an amorphous silicon film 52 respectively. Subsequently, the photo-resist pattern 70 is removed by exposing the substrate W in oxygen ($O_2$) plasma.

Figure 1B:
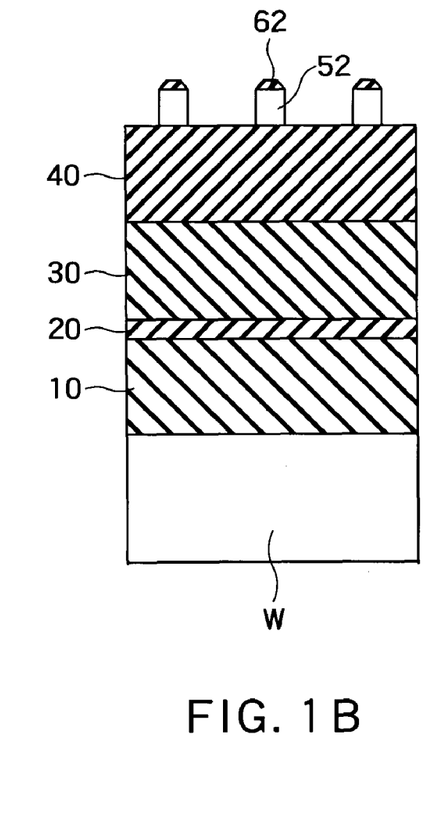

Next, the amorphous silicon film 52 is thinned by wet etching (FIG. 1B). This causes a pattern smaller than a resolution limit of photo etching to be formed at a line-and-space size ratio of about 1:3.

Figure 1C:
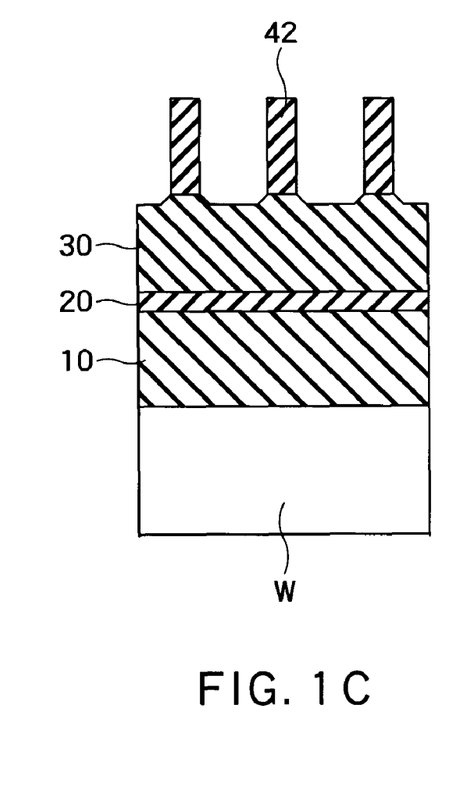

Next, the silicon nitride film 40 is processed by using the antireflection film 62 and the amorphous silicon film 52 as masks, thereby providing a silicon nitride film 42. The silicon nitride film 42 acts as a core material for forming sidewall patterns. Subsequently, the amorphous silicon film 52 is removed (FIG. 1C).

Figure 2A:
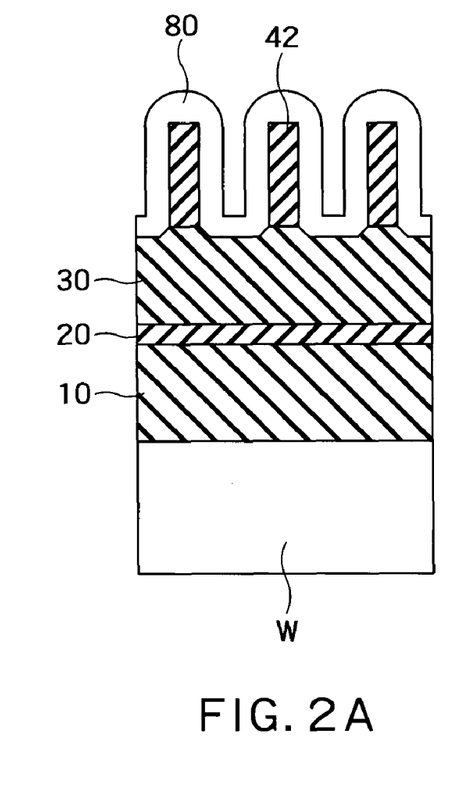
Figure 2B:
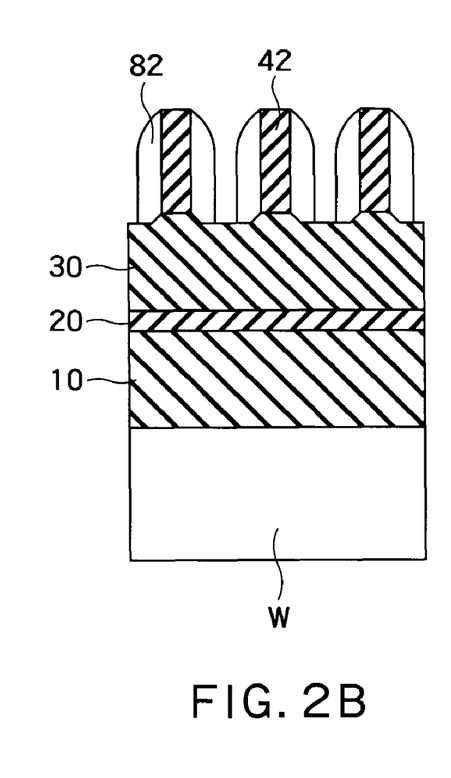
Figure 2C:
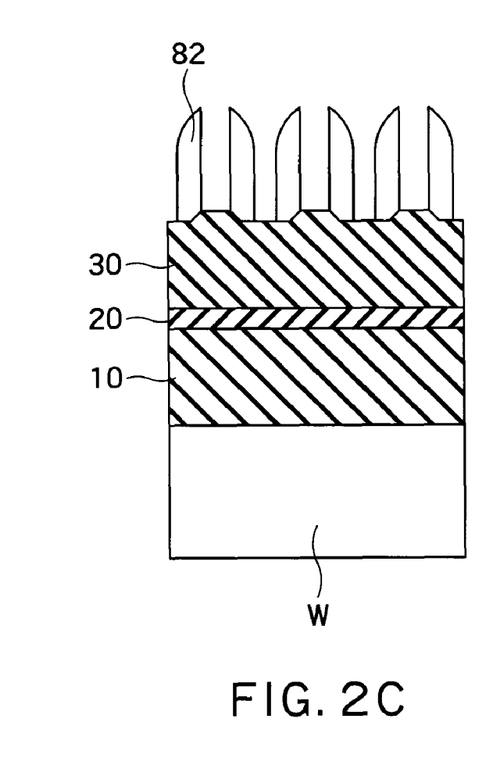

Next, as shown in FIG. 2A, an amorphous silicon film 80 is deposited by LPCVD and then processed through etch-back by use of RIE, thereby exposing the top surfaces of the silicon nitride film 42 and a part of the surfaces of the silicon oxide film 30 (FIG. 2B). Subsequently, the silicon nitride film 42, which acts as the core material, is removed by wet etching, thus forming a pattern by the amorphous silicon film 82 (FIG. 2C). This pattern is referred to as a sidewall pattern.

Subsequently, the under-layer silicon oxide film 30 is processed by RIE using the sidewall pattern 82 as a mask, thereby forming a trench in which interconnection lines are to be embedded. It is to be noted that the silicon oxide film 10 below a position where the trench is formed by RIE has a plug (not shown) allocated in it. In this RIE processing, to prevent the edges of the mask from warping inward (hereinafter referred to as "mask warpage" simply), the following low ion energy level conditions are employed.

Figure 3:
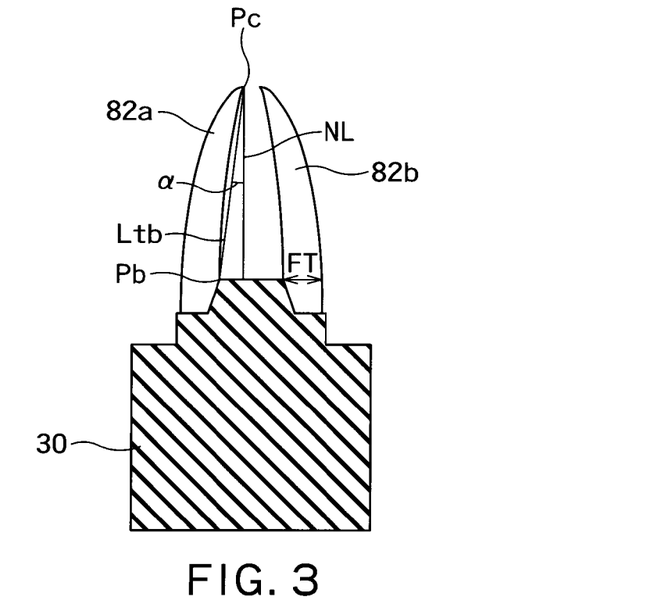
FIG. 3 is an explanatory view of definition of a taper angle.

First, an index that indicates the degree of mask warpage will be described below with reference to FIG. 3. As shown in FIG. 3, sidewall patterns 82a and 82b are considered which correspond to one core material; then, if mask warpage occurs, some angle α may be formed between a normal line NL of the under-layer top surface and a line segment Ltb which interconnects a portion Pc where the sidewall patterns 82a and 82b are nearest to each other and an internal point of contact Pb between the sidewall patterns 82a and 82b and the underlying layer 30. This angle α is defined as a taper angle, and a region where α<0.7° is defined as a region free of mask warpage because the error range of measurement is ±0.7°. It is to be noted that in the present specification, a thickness of a sidewall pattern (length represented by a symbol FT in FIG. 3) in a case where this pattern is cut along a plane including the under-layer top surface is defined as a film thickness of the sidewall pattern. In the present embodiment, the sidewall pattern film thickness is assumed to be 30 nm or less.

In this case, for example, if a high- and low-frequency multi-frequency superimposition dry-etch apparatus is used during the processing of the under-layer, low ion energy level RIE may be realized by turning down the power of low frequencies, which are liable to give rise to a self-bias voltage. The following experiments to evaluate a threshold value at which mask warpage occurs were conducted, on the assumption that a self-bias voltage exists that provides this threshold value. A sample sidewall pattern was made of an amorphous silicon film formed at 525° C. If such an amorphous silicon film is used, mask warpage is expected to occur at a pattern size of 30 nm or less, and especially tends to occur significantly at a size of 25 nm or less. Thus, two kinds of samples having film thicknesses of 19.5 nm and 22.1 nm were prepared. They both have a height of 90 nm. It is to be noted that in a case where amorphous silicon is crystallized through annealing at a temperature higher than 600° C., if a crystalline silicon film is formed at a temperature higher than 600° C., it may be possible to form a sidewall pattern having improved tolerance to mask warpage. However, if the substrate is exposed to a high temperature higher than 600° C. in formation of a trench structure for interconnection lines as in the case of the present embodiment, semiconductor elements formed on the substrate may be damaged. Therefore, in the experiments, a sidewall pattern, which was made of, a non-crystalline silicon film formed at a temperature of 600° C. or lower was used as the sample.

Figure 4:
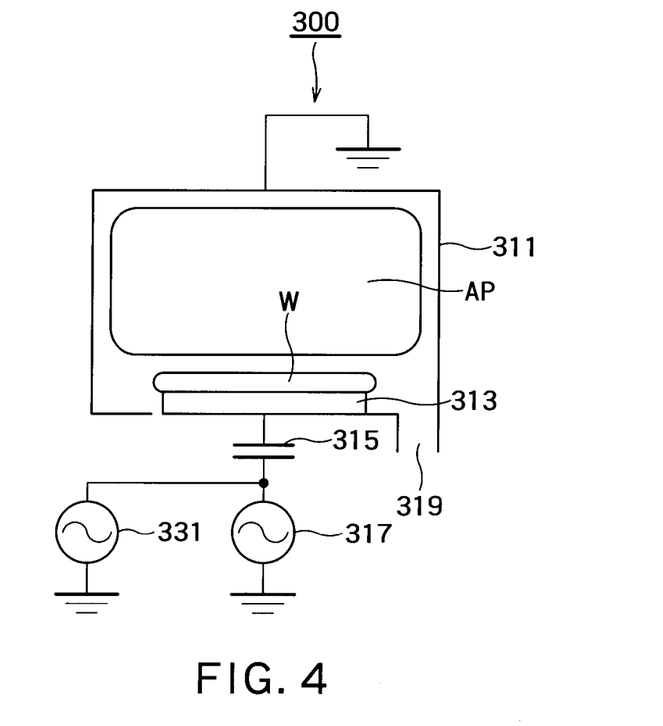
FIG. 4 is a block diagram showing one example of a semiconductor manufacturing apparatus which is used in the first embodiment of the semiconductor device manufacturing method according to the present invention.

FIG. 4 is a block diagram showing one example of a multi-frequency superimposition dry-etch apparatus used in the experiments. A parallel plate type dry-etch apparatus 300 shown in FIG. 4 includes a vacuum reaction chamber 311, a substrate mounting table 313, a blocking capacitor 315, high-frequency power supplies 317 and 331, and a gas exhaust outlet 319.

The vacuum reaction chamber 311 is grounded as an anode. The substrate-mounting table 313 is electrically connected to the blocking capacitor 315 and also has a processing-target substrate W mounted on its upper surface. Each of the high-frequency power supplies 317 and 331 has its one end grounded and the other end connected to the blocking capacitor 315. The substrate-mounting table 313 is electrically connected as a cathode to the blocking capacitor 315 and the high-frequency power supplies 317 and 331. Almost all the internal space of the vacuum reaction chamber 311 provides a plasma formation region AP. In the present embodiment, the high-frequency power supplies 317 and 331 correspond to, for example, first and second power supplies respectively.

In the experiments, a mixture gas containing, for example, octafluoro-cyclobutane ($C_4F_8$) as a fluorocarbon-based gas, carbon monoxide (CO), and argon (Ar) into the dry-etch apparatus 300 is introduced into the vacuum reaction chamber 311 via a gas intake opening (not shown) on the top surface thereof and high-frequency power is supplied by using the high-frequency power supplies 317 and 331 to thereby generate high-frequency plasma in the plasma formation region AP, thus drawing ions in the plasma onto the processing-target substrate W by utilizing a self-bias due to the existence of the blocking capacitor 315. With this, the under-layer silicon oxide film 30 was processed using the sidewall pattern 82 as a mask. More specifically, the substrate W was regulated to a temperature of 40° C. and a pressure of about 20 mTorr and 13.56 MHz and 100 MHz were set as frequencies of the high-frequency power supplies 317 and 331 respectively. In processing the silicon oxide film 30 the power of the low-frequency 13.56 MHz was changed from 0 W to 3500 W while the power of the high-frequency 100 MHz was set to about 1000 W. Under these conditions, a self-bias voltage Vdc changed from 10 V to about 1140 V.

It was proved that, by supplying the gas only with 100 MHz high-frequency power and without 13.56 MHz frequency power during the dry-etch processing, the self-bias voltage Vdc was reduced to about 10 V which acts on the drawing-in of the ions onto the samples. As a result, the influence of ion impact on the sidewall pattern 82 was suppressed, to enable preventing the sidewall pattern 82 from warping. Moreover, by changing the frequencies of the high-frequency power supplies 317 and 331, the self-bias voltage Vdc could be reduced to a value less than 10 V.

Figure 5:
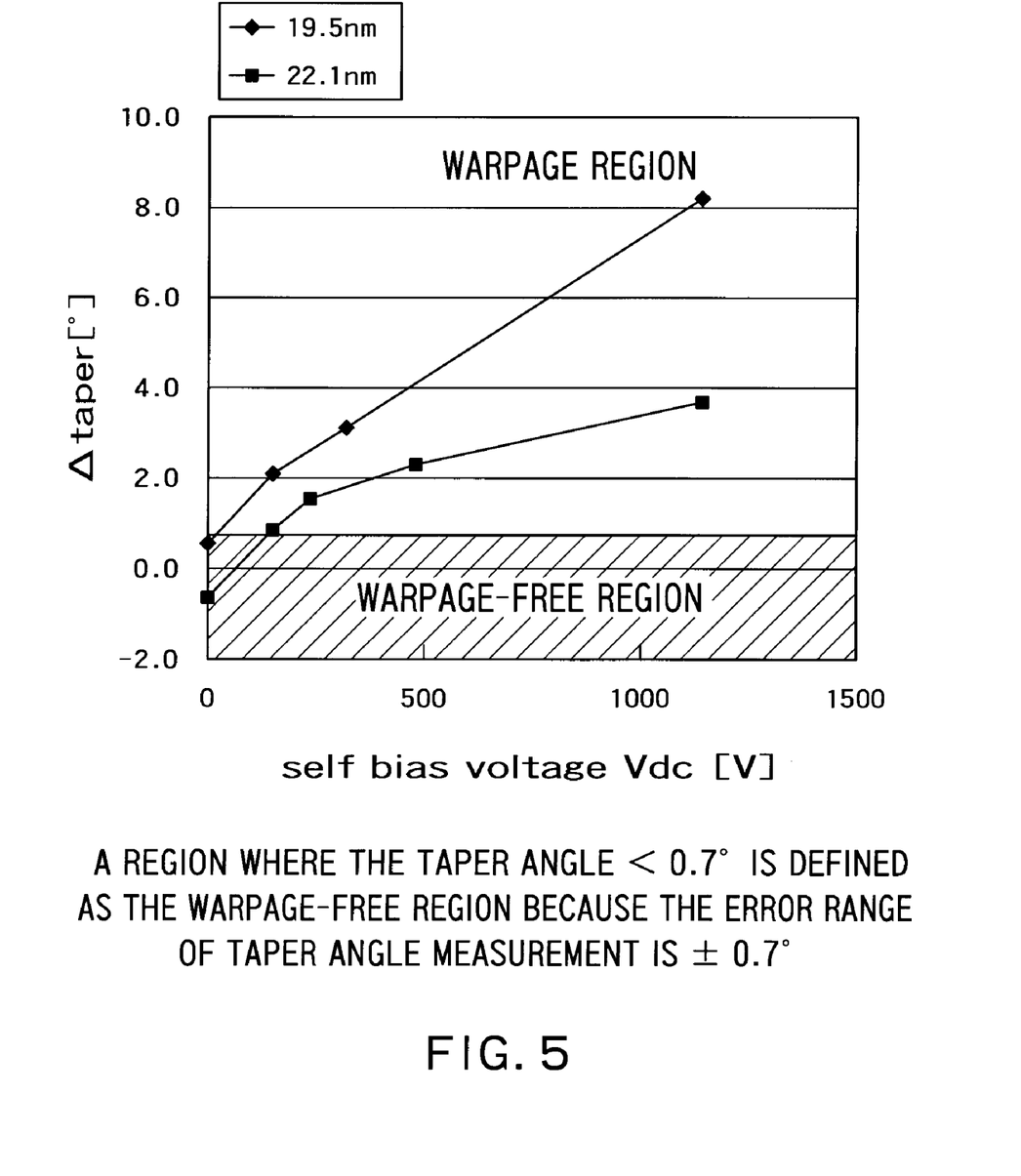
FIG. 5 is a graph showing one example of results of evaluating an amount of change in a sidewall pattern angle as a function of a self-bias voltage.

FIG. 5 is a graph showing one example of results of evaluating an amount of change Δ in a taper angle α of the sidewall pattern as a function of the self-bias voltage Vdc.

The sidewall pattern 82 started warping from a value of 10 V in the case of the 19.5-nm sample and from a value of 130 V in the case of the 22.1-nm sample, while the taper angle α increased as the self-bias voltage Vdc increased. By comparison, no mask warpage occurred in the case of the sample having a film thickness of about 32 nm.

Figure 6:
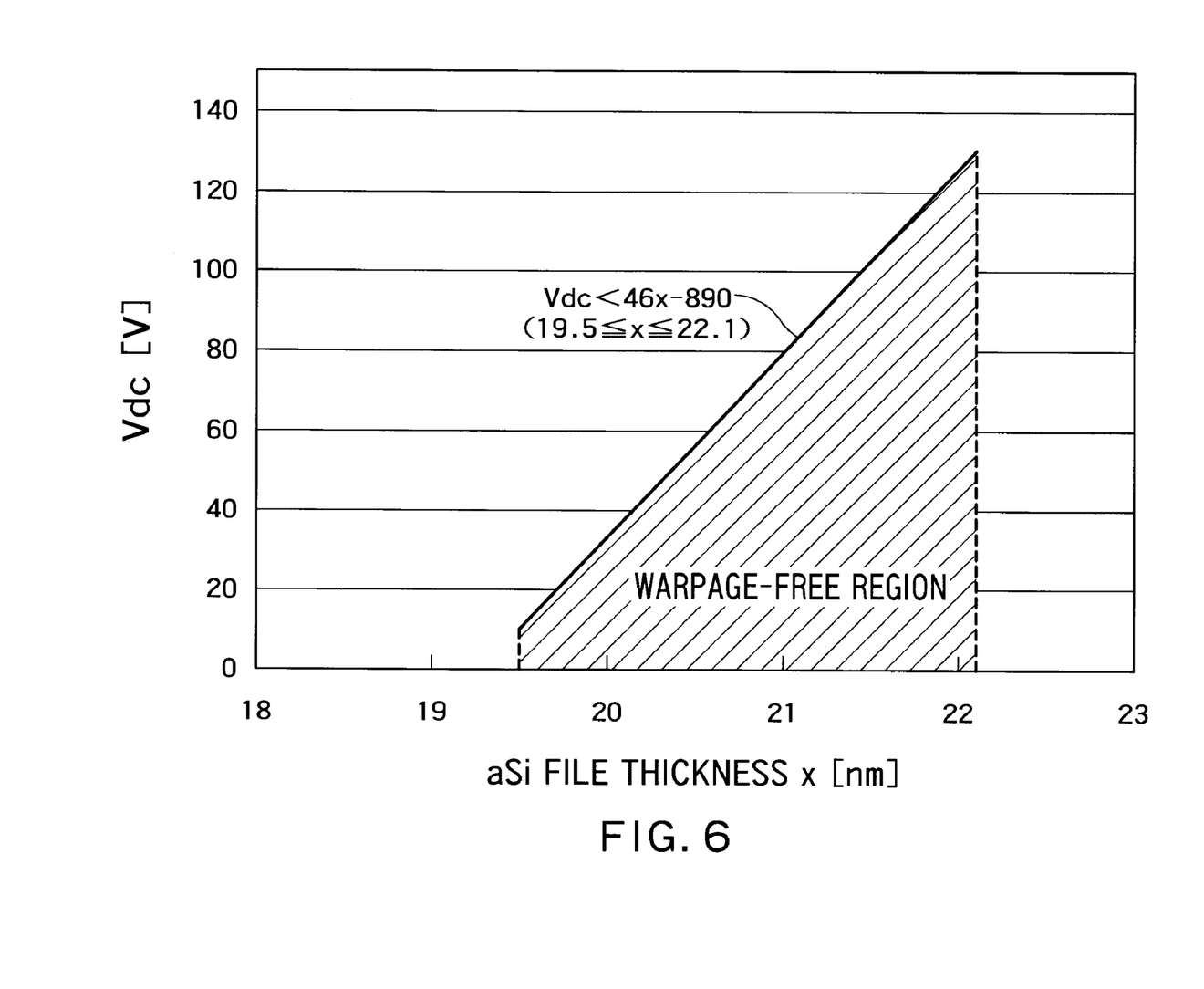
FIG. 6 is a graph showing a relation between an amorphous silicon film thickness and the self-bias voltage.

FIG. 6 is a graph showing a relation between an amorphous silicon film thickness x [nm] (19.5≦x≦22.1) and a self-bias voltage Vdc [V] which provides a threshold value at which mask warpage occurs. FIG. 6 shows that no mask warpage will occur in a range that satisfies Vdc<46x−890.

From this, it was found that a trench structure for embedding interconnection lines can be formed well by using the self-bias voltage Vdc having a value satisfying the following relational expression in the RIE processing of the under-layer silicon oxide film 30:

$$Vdc<46x-890$$

Figure 7:
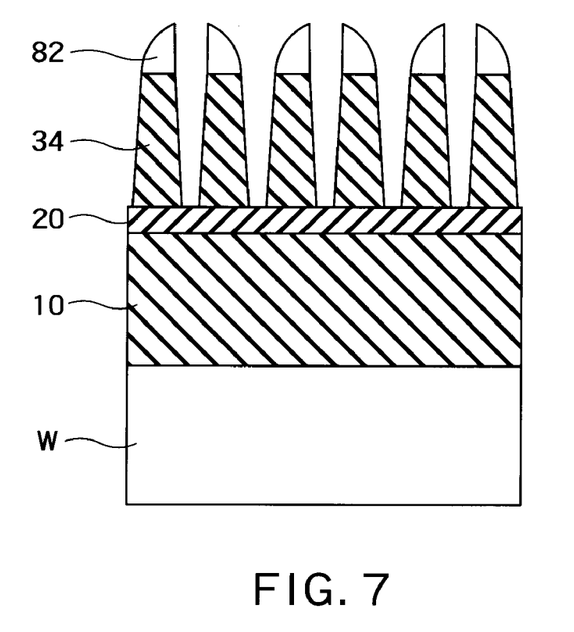
FIG. 7 is an abbreviated cross-sectional view showing one example of a trench structure formed in accordance with the relation shown in FIG. 6.

FIG. 7 is an abbreviated cross-sectional view showing one example of a trench structure formed by using a self-bias voltage Vdc value satisfying the above relational expression. The silicon oxide film 30 is selectively removed until the top surface of the silicon nitride film 20, which acts as a processing stopper film, is exposed, thus giving a silicon oxide film 34 to which the sidewall pattern 82 is transferred well.

Figure 8:
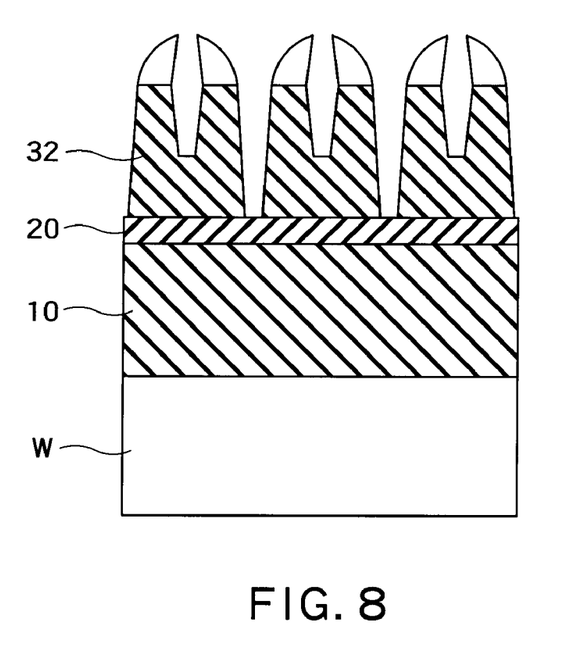
FIG. 8 is an abbreviated cross-sectional view showing one example of a trench structure formed in accordance with a conventional technique.

For comparison, one example of a trench structure formed with the conventional technique is shown in an abbreviated cross-sectional view of FIG. 8. The example of FIG. 8 shows that due to the occurrence of mask warpage, the under-layer silicon oxide film 32 was not removed well, so that a large step is generated between the neighboring trenches.

Following the process shown in FIG. 7, trenches for interconnection lines are formed by further advancing the dry-etch processing by using the sidewall pattern 82 as a mask at a low ion energy level by the self-bias voltage Vdc value that satisfies the above relational expression so that the silicon nitride film 20 may also be processed. Then, by embedding the interconnection lines in the trenches, it is possible to obtain fine interconnection lines having a line width of 30 nm or less.

(2) Second Embodiment

Next, the second embodiment of the semiconductor device manufacturing method according to the present invention will be described below with reference to FIGS. 9A to 12B. The present embodiment relates to the formation of a trench structure for shallow trench isolation (STI) of a nonvolatile semiconductor storage device.

Figure 9A:
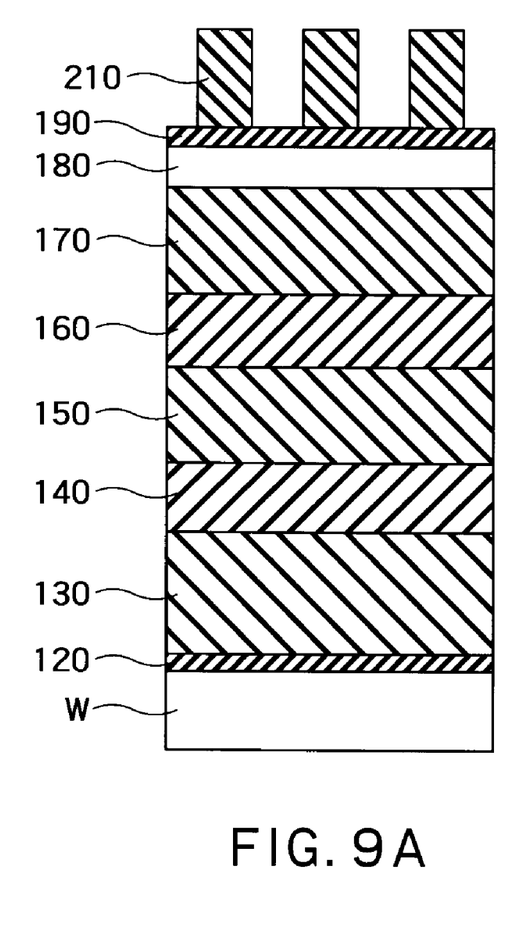

First, a layer stack film is formed on a substrate. Specifically, as shown in FIG. 9A, a silicon oxide film 120 acting as a gate oxide film and a polycrystalline silicon film 130 acting as a floating gate are deposited on a silicon substrate W. Subsequently, a silicon nitride film 140, a silicon oxide film 150, a silicon nitride film 160, a silicon oxide film 170 which provides a core material, an amorphous silicon film 180, and an antireflection film 190 are deposited sequentially by LPCVD. The silicon nitride film 160 and the silicon oxide film 170 correspond to, for example, first and second insulating films in the present embodiment.

Figure 9B:
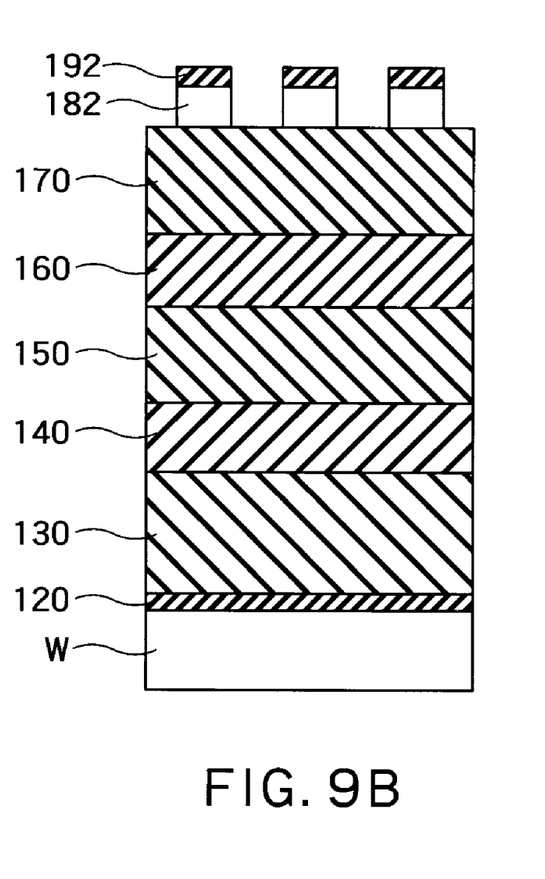
Figure 10A:
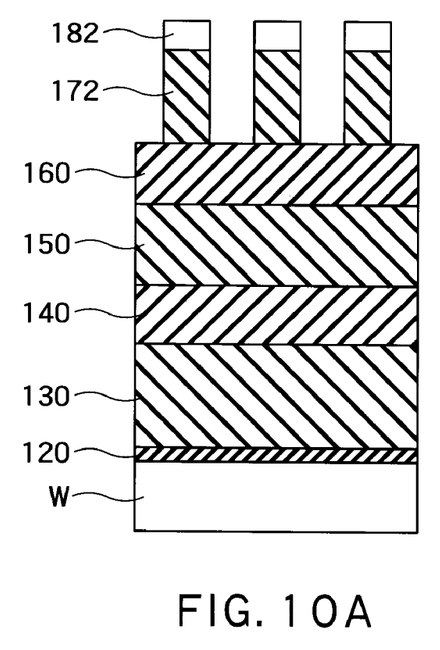

Next, a photo-resist is applied on the antireflection film 190 and then processed into a desired pattern 210 by utilizing photo etching. Subsequently, as shown in FIG. 9B, the antireflection film 190 and the amorphous silicon film 180 are processed through RIE by using the pattern 210 as a mask, thereby providing an antireflection film 192 and an amorphous silicon film 182 respectively. Subsequently, the photo-resist is removed by exposing the substrate W in oxygen ($O_2$) plasma and then, the silicon oxide film 170 is processed using the amorphous silicon film 182 as a mask, to provide a silicon oxide film 172 as shown in FIG. 10A.

Figure 10B:
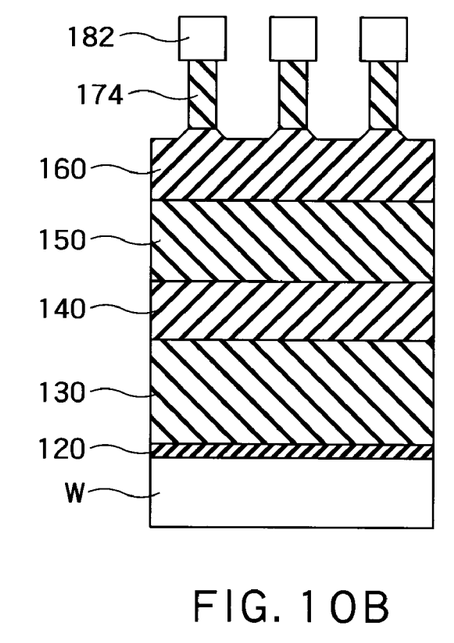
Figure 10C:
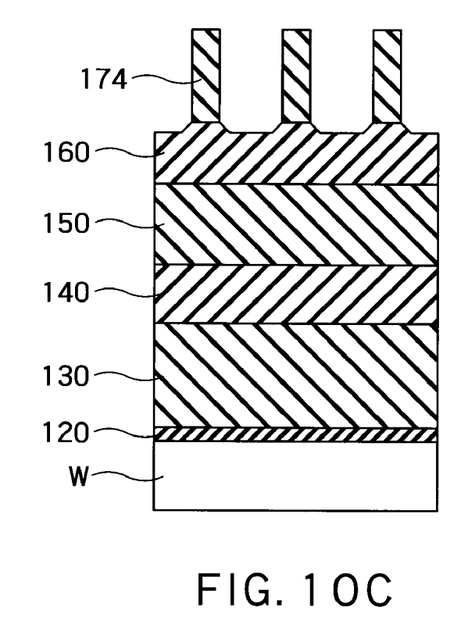

Next, the silicon oxide film 172 is thinned by wet etching as shown in FIG. 10B, to then remove the amorphous silicon film 182. Thus, as shown in FIG. 10C, a core material pattern 174 is obtained which has a size smaller than a resolution limit of photo etching.

Figure 11A:
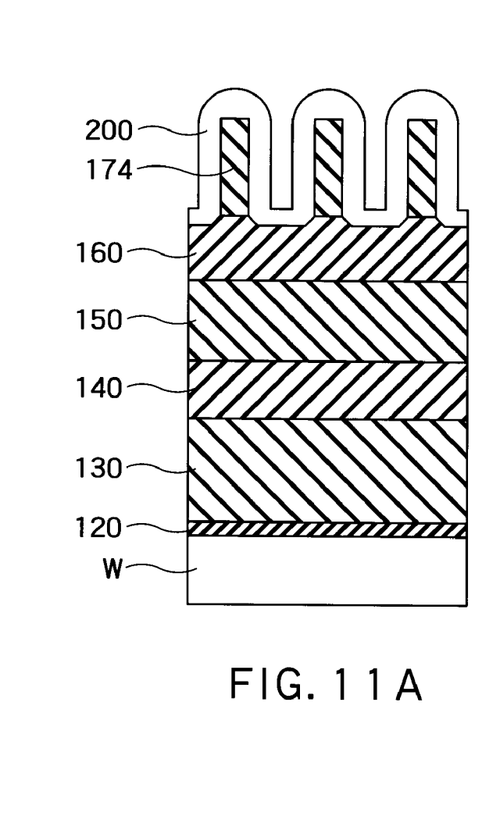
Figures 11B, 11C:
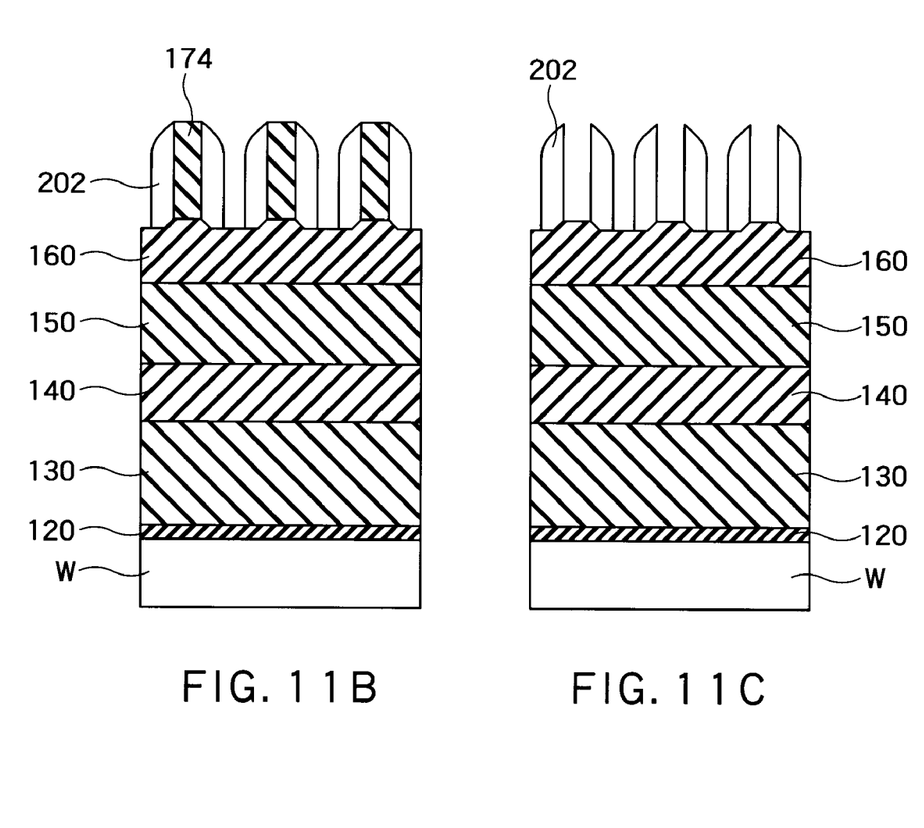

Next, as shown in FIG. 11A, an amorphous silicon film 200 is deposited by LPCVD and then processed through etch-back by use of RIE, thereby exposing the top surfaces of the core material pattern 174 and a part of the surfaces of the silicon nitride film 160 as shown in FIG. 11B. Subsequently, the core material pattern 174 made of a silicon oxide film is removed by wet etching, thus obtaining a sidewall pattern 202 formed of an amorphous silicon film as shown in FIG. 11C.

Figure 12A:
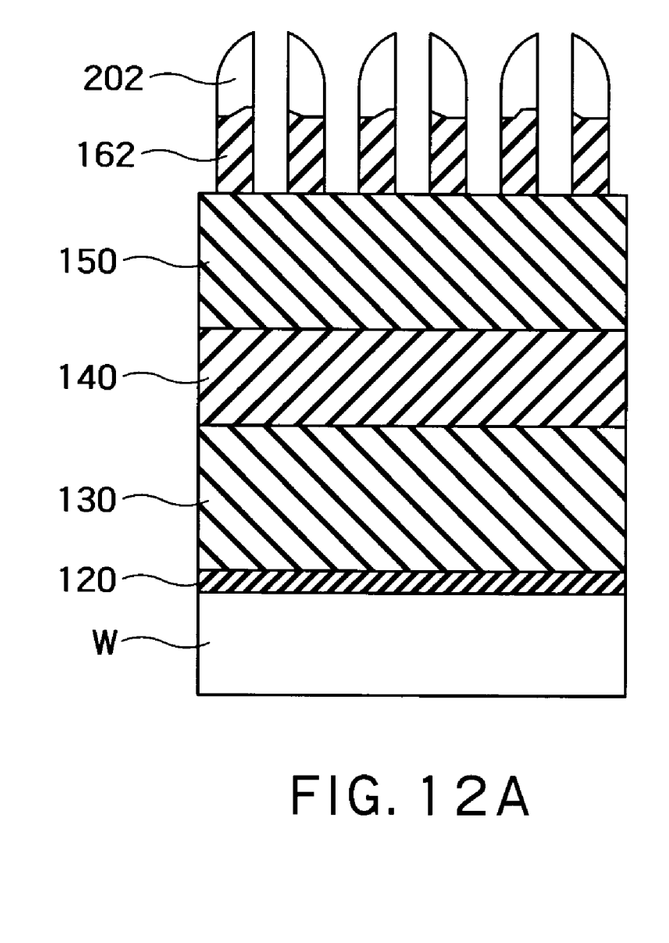

Subsequently, by processing the silicon nitride film 160 by using the formed sidewall pattern 202 as a mask, a line-and-space pattern of a silicon nitride film 162 can be formed as shown in FIG. 12A. In the RIE processing carried out in this case, the aforementioned low ion energy level conditions used in the first embodiment are employed to prevent mask warpage in a case where the sidewall pattern 202 has a film thickness of 30 nm or less.

Figure 12B:
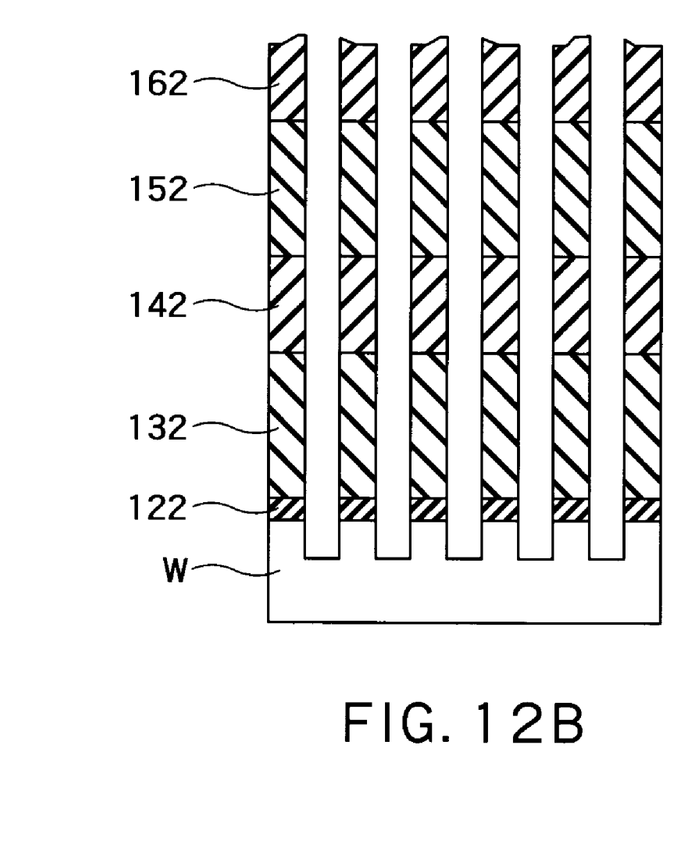

Subsequently, by processing the silicon oxide film 150, the silicon nitride film 140, the polycrystalline silicon film 130, the silicon oxide film 120, and the silicon substrate W sequentially to provide a silicon oxide film 152, a silicon nitride film 142, a polycrystalline silicon film 132, and a silicon oxide film 122 respectively, a trench for STI can be formed in the silicon substrate W.

Although the present invention has been described with reference to the embodiments, the present invention is not limited to those embodiments and can be variously changed and applied within the scope thereof. For example, as the first insulating film directly under the sidewall pattern and the second insulating film which acts as a core material, the first embodiment has used a combination of the silicon oxide film 30 and the silicon nitride film 40 and the second embodiment has used a combination of the silicon nitride film 160 and the silicon oxide film 170. However, the insulating films are never limited to those combinations; besides these, it is also possible to use a combination of, for example, a silicon oxide film and a film containing carbon as its main component or a silicon nitride film and a film containing carbon as its main component.

What is claimed is:

1. A semiconductor device manufacturing method comprising:
    depositing a first insulating film and a second insulating film above a substrate sequentially and forming a pattern on the second insulating film;
    forming a silicon film on the pattern;
    forming a sidewall made of the silicon film by processing the silicon film until a part of the second insulating film is exposed by use of etch-back;
    removing the second insulating film; and
    performing dry etching by use of a fluorocarbon-based gas, to process the first insulating film by using the sidewall as a mask, wherein processing of the first insulating film comprises applying on the substrate a self-bias voltage Vdc that satisfies a relational expression of Vdc<46x−890, where a film thickness of the silicon film that constitutes the sidewall is x nm (19.5≦x≦22.1).

2. The method of claim 1,
wherein the processing of the first insulating film is performed by using a dry etching apparatus capable of supplying a plurality of high-frequency powers to an electrode on a side of the substrate, and by setting the lower-frequency power of the plurality of high-frequency powers to 0 W during the dry etching.

3. The method of claim 1,
wherein the silicon film is amorphous.

4. The method of claim 1,
wherein the silicon film is formed at 600° C. or less.

5. The method of claim 4,
wherein the processing of the first insulating film comprises forming by the dry etching a trench in which an interconnection line is to be embedded, in the first insulating film.

6. The method of claim 1,
wherein the processing of the first insulating film comprises performing the dry etching by using a mixture gas containing octafluoro-cyclobutane ($C_4F_8$), carbon monoxide (CO) and argon (Ar).

7. The method of claim 1,
wherein a combination of the first and second insulating films is a combination of a silicon oxide film and a silicon nitride film.

8. The method of claim 1,
wherein a combination of the first and second insulating films is a combination of a silicon oxide film and a film containing carbon as its main component.

9. The method of claim 1,
wherein a combination of the first and second insulating films is a combination of a silicon nitride film and a silicon oxide film.

10. The method of claim 1,
wherein a combination of the first and second insulating films is a combination of a silicon nitride film and a film containing carbon as its main component.

11. A semiconductor device manufacturing method comprising:
depositing a first insulating film and a second insulating film above a substrate sequentially and forming a pattern on the second insulating film;
forming a silicon film on the pattern;
forming a sidewall made of the silicon film by processing the silicon film until a part of the second insulating film is exposed by use of etch-back;
removing the second insulating film; and
performing dry etching by use of a fluorocarbon-based gas, to process the first insulating film by using the sidewall as a mask,
wherein processing of the first insulating film is carried out by using a semiconductor manufacturing apparatus comprising a reaction chamber, a substrate mounting table, a first power supply capable of supplying the substrate mounting table with a power having a first frequency, a second power supply capable of supplying the substrate mounting table with a power having a second frequency higher than the first frequency, and a blocking capacitor interposed between the substrate mounting table and the first and second power supplies, and by supplying the substrate mounting table with the power from the second power supply in a condition where supply of the power from the first power supply is halted.

12. The method of claim 11,
wherein the silicon film is amorphous.

13. The method of claim 11,
wherein the silicon film is formed at 600° C. or less.

14. The method of claim 13,
wherein the processing of the first insulating film comprises forming by the dry etching a trench in which an interconnection line is to be embedded, in the first insulating film.

15. The method of claim 14, wherein the silicon film that constitutes the sidewall has a film thickness of 30 nm or less.

16. The method of claim 11,
wherein the processing of the first insulating film comprises performing the dry etching by using a mixture gas containing octafluoro-cyclobutane ($C_4F_8$), carbon monoxide (CO) and argon (Ar).

17. The method of claim 11,
wherein a combination of the first and second insulating films is a combination of a silicon oxide film and a silicon nitride film.

18. The method of claim 11,
wherein a combination of the first and second insulating films is a combination of a silicon oxide film and a film containing carbon as its main component.

19. The method of claim 11,
wherein a combination of the first and second insulating films is a combination of a silicon nitride film and a silicon oxide film.

20. The method of claim 11,
wherein a combination of the first and second insulating films is a combination of a silicon nitride film and a film containing carbon as its main component.

* * * * *